United States Patent [19]

Tan

[11] Patent Number: 5,255,217
[45] Date of Patent: Oct. 19, 1993

[54] INTEGRATED CIRCUIT MEMORY DEVICE WITH A REDUNDANT MEMORY BLOCK

[75] Inventor: Charles M. C. Tan, Campbell, Calif.

[73] Assignee: Hewlett-Packard Company, Palo Alto, Calif.

[21] Appl. No.: 818,667

[22] Filed: Jan. 9, 1992

[51] Int. Cl.$^5$ .............................................. G11C 13/00
[52] U.S. Cl. ...................................... 365/96; 365/210
[58] Field of Search ................... 365/96, 94, 200, 210

[56] References Cited

U.S. PATENT DOCUMENTS 5,146,429  9/1992  Kawai et al. ........................... 365/96

Primary Examiner—Terrell W. Fears
Attorney, Agent, or Firm—Howard R. Boyle; Denise A. Lee

[57] ABSTRACT

A semiconductor memory device is provided with a plurality of primary memory cell blocks and a replacement memory cell block identical in size to the primary memory cell blocks. The replacement memory block includes all the required analog row and column driver and sense circuitry for the memory cells contained in the replacement block. Each of the primary memory blocks has a laser fuse that will disable the associated primary memory block and enable the replacement memory block such that the total amount of logical memory in the memory device is unaffected by a defective primary block.

17 Claims, 3 Drawing Sheets

INTEGRATED CIRCUIT MEMORY DEVICE WITH A REDUNDANT MEMORY BLOCK

FIELD OF THE INVENTION

The present invention relates to the field of integrated circuit (IC) memory devices. In particular, this invention is manifested in a memory device that includes a redundant memory block to replace a defective memory block.

BACKGROUND OF THE INVENTION

Integrated circuit memory devices are well known and widely used within the electronics industry. Driven by the needs of the industry, IC memory producers have continued to design and build ever more complex and dense memory devices. The state of the art in memory devices is such that today a memory device containing 4 million bits of data is the same physical size as a memory device containing 500 bits was eight years ago.

A result of the dramatic increase in the density of the memory devices is an equally dramatic increase in the precision and care required to produce the devices. The slightest imperfection or anomaly in the manufacturing process will cause a defective device to be produced. Since a device cannot be tested until all the manufacturing processes are completed, considerable time and expense is wasted on each defective device.

As the memory devices become denser, the yield of good devices to bad devices goes down, thereby effectively increasing the cost of producing good devices. The memory device industry has recognized that often a defective device has only one or a few bad memory cells out of the millions of cells that make up the device. Also the bad memory cells are often grouped closely together as a result of a localized problem that occurred during manufacturing.

To increase the yield of useable devices, the manufacturers of memory devices in the prior art have designed the devices to contain redundant rows and columns of memory cells that can replace bad rows and columns as necessary. Generally, no more than two redundant rows and columns are provided. After testing, a high resolution laser is used to disconnect the row or column of cells that contains the defective cell. A redundant row or column is then connected in place of the defective row or column by enabling complex circuitry on the memory device. While this process works, the process has many drawbacks. For example, a laser having the required resolution of about 1 micron (one millionth of a meter) is very expensive and requires elaborate and expensive optical alignment systems to control where on the device the laser cuts. Also, the memory cells operate at low analog voltage levels where the signal to noise ratio is very low. Splicing in the redundant cells adds to the interconnection length and circuitry required to connect the cells to sensors used to detect the voltage levels of the cells. This additional connection length and circuitry reduces the signal to noise level further and slows down the operation of the memory device.

The memory industry clearly needs a solution to the low yield problem that does not adversely affect the performance of the memory device and eliminates the need for high resolution lasers.

SUMMARY OF THE INVENTION

The present invention improves the manufacturing yield of good memory devices by providing a redundant block of memory to replace a block of memory with a defective cell. By the simple process of opening a single fusible link, the defective block is disabled and the redundant block is enabled. This fusible link is easily opened by a low resolution laser.

In the preferred embodiment, a memory device includes multiple memory blocks with each block having a unique address. Each memory block also has associated with it a fusible link. If the fusible link for a particular block is open, that block of memory will be disabled, the redundant memory block will be enabled, and the addresses of the good memory blocks will be reordered. The automatic reordering of the memory block addresses is performed to maintain the contiguous addressing as if the defective block had not been disabled.

Since each block of memory contains all the row and column analog circuitry used by that block, the replacement of a defective block with a redundant block does not add to the path length, or decrease the signal-to-noise ratio of any of the analog circuitry contained in the memory device. As such, the performance of the memory device remains unaffected by the replacement of a block of memory. This is a major advancement over the prior art.

The design of the present invention ensures that only one fusible link will need to be opened to replace a defective block of memory. Since there is no need to effect changes in the memory cell area, a high precision task, the use of an expensive high resolution laser is not required. Instead, to open a fusible link, an inexpensive low resolution laser is used. This ability to use a low resolution laser is a major advantage over the prior art.

DETAILED DESCRIPTION OF THE INVENTION

Figure 1:
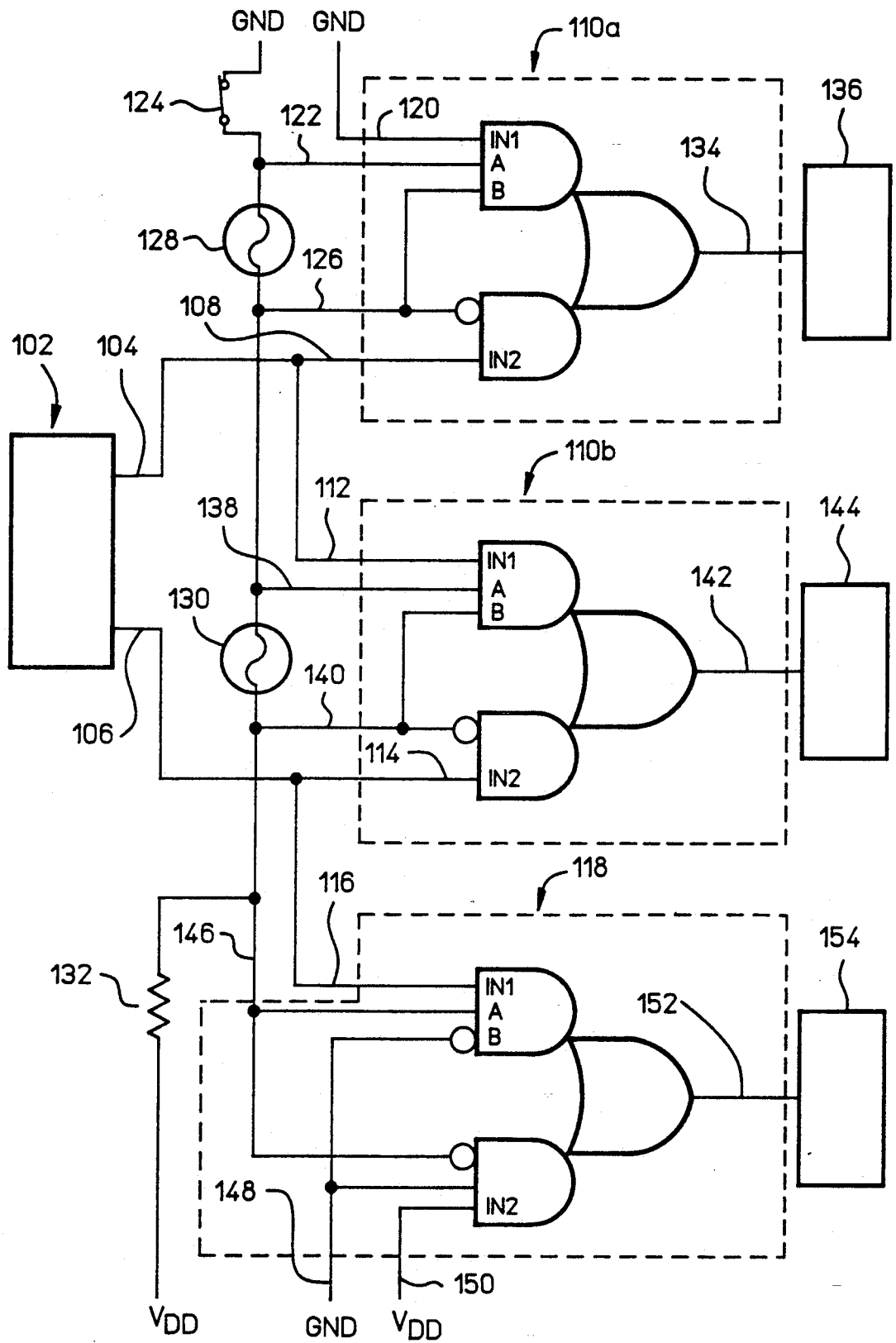
FIG. 1 is a simplified schematic diagram of two memory blocks, a redundant memory block, and a memory block select circuit.

A simplified memory system incorporating the present invention is shown in FIG. 1. As shown in FIG. 1, a memory block selector 102 has a first output 104 and a second output 106. The first output 104 is connected to an "IN2" input 108 of a first logic block 110a and to an "IN1" input 112 of a second logic block 110b. Output 106 is connected to an "IN2" input 114 of the second logic block 110b and to an "IN1" input 116 of another logic block 118.

Input "IN1" 120 of the first logic block 110a is connected to ground. Input "A" 122 of the first logic block 110a is connected through a normally closed switch 124 to ground. Input "B" 126 of the first logic block 110a is connected through a fuse 128 and the switch 124 to ground. Input 126 is also connected through a second fuse 130 and a pull up resistor 132 to a voltage source Vdd. Output 134 of the first logic block 110a is connected to a memory block 136.

Input "A" 138 of the second logic block 110b is connected through the fuse 128 and the switch 124 to ground. Input "A" 138 is also connected through the fuse 130 and the pull-up resistor 132 to Vdd. Input "B" 140 of the second logic block 110b is connected through the pull-up resistor 132 to Vdd. Input "B" 140 is connected through the two fuses 130 and 128 and the switch 124 to ground. Output 142 of the second logic block is connected to another memory block 144.

Input "A" 146 of the logic block 118 is connected to Vdd through pull-up resistor 132. Input 146 is also connected to ground through the fuses 130 and 128 and the switch 124. Input "B" 148 of the logic block 118 is connected to ground. Input "IN2" 150 of the logic block 118 is connected to Vdd. Output 152 of the logic block 118 is connected to a memory block 154.

The memory system consists of three memory blocks 136, 144 and 154 and the respective selection circuitry, the first and second logic blocks 110 and the logic block 118. If the memory blocks 136 and 144 are fully functional, the memory block selector 102 selects the memory block 136 by using the first output 104. Memory block 144 is selected by the memory block selector 102 by using the second output 106.

If during testing a defect is detected in the memory block 136, the fuse 128 is opened through the use of a laser, even a low resolution one. With the fuse 128 opened, the first logic block 110a prevents the selection of the memory block 136. When the memory block selector 102 uses the first output 104, the second logic block 110b will enable the memory block 144. In like manner, when the memory block selector 102 uses the second output 106, the logic block 118 will enable the memory block 154.

If during testing memory block 136 was good but a defect was detected in memory block 144, the fuse 130 would be opened through the use of a laser. Now the second logic block 110b prevents the memory block 144 from being selected. By using the first output 104, the memory block selector will select memory block 136. When the second output 106 is used by the memory block selector 102, logic block 118 will enable the replacement memory block 154.

The purpose of the fuses 128 and 130 is to disable the associated memory block, for example, memory block 136 is disabled by fuse 128. When a fuse is opened, the next succeeding memory block replaces the disabled block. For example, when fuse 128 is opened, memory block 144 replaces memory block 136. The memory block 154 then replaces the memory block 144. By using this replacement scheme, the memory device is still fully functional even if one of the memory blocks is defective.

Switch 124 is used during testing to verify the integrity of the redundant memory block 154. When the switch 124 is opened, memory block 136 is disabled and memory block 154 is testable. In practice, the switch 124 would be a pin on the memory device.

The truth table for the first and second logic blocks is listed in Table 1 and the truth table for the logic block 118 is listed in Table 2.

TABLE 1

| INPUT | | OUTPUT |
|---|---|---|
| A | B | OUT |
| 0 | 0 | IN2 |
| 1 | 0 | IN2 |
| 0 | 1 | 0 |

TABLE 1-continued

| INPUT | | OUTPUT |
|---|---|---|
| A | B | OUT |
| 1 | 1 | IN1 |

TABLE 2

| INPUT | | OUTPUT |
|---|---|---|
| A | B | OUT |
| 0 | 0 | 0 |
| 0 | 1 | IN2 |
| 1 | 0 | IN1 |
| 1 | 1 | 0 |

Figure 2:
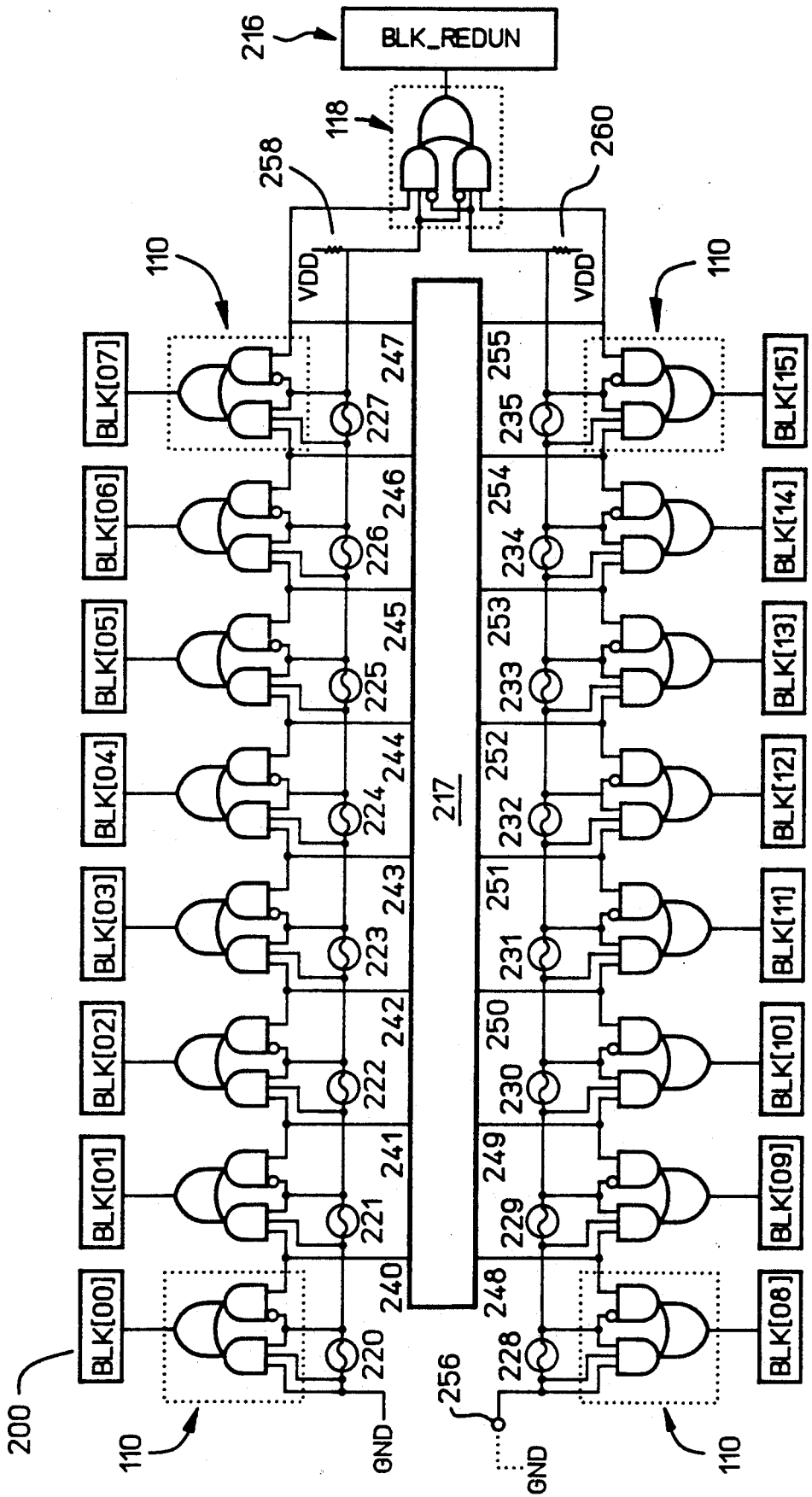
FIG. 2 is a schematic diagram of a preferred embodiment of the present invention manifested in a memory device.

FIG. 2 shows a memory device incorporating a preferred embodiment of the present invention. This memory device has a memory block selector 217 which selects between 16 memory blocks 200–215 plus a replacement memory block 216 by using outputs 240–255. The operation of this memory device is essentially as described above. If a fuse is opened, the memory block associated with the fuse is disabled, the next memory block in sequence replaces the disabled memory block, each logically succeeding memory block replacing the previous one, and finally the replacement memory block replaces the last memory block in logical sequence in the row.

For example, if fuse 225 is opened, the associated memory 205 is disabled. If the memory block selector 217 selects memory block 205 using output 245, memory block 206 will be selected instead. A selection of memory block 206 will be transferred to memory block 207 and a selection of memory block 207 will be transferred to the replacement memory block 216.

In like manner if fuse 234 is opened, memory block 214 is disabled and a selection of memory block 214 will be transferred to memory block 215. A selection of memory block 215 will be transferred to the replacement memory block 216.

The replacement memory block 216 will replace a defective memory block in one of the two rows of memory, 200–207 or 208–215. In the present example, the overhead burden for the memory device is 1/16, i.e., one replacement block per 16 blocks. One skilled in the art will understand additional replacement blocks could easily be incorporated, thereby reducing the overhead burden by changing the ratio of memory blocks per replacement memory block.

A device pin 256 is tied to ground (logic state 0) during the normal operation of the memory device. However, by removing the pin 256 from ground potential, a pull-up resistor 258 will change the pin 256 to logic state 1 and enable the replacement memory block 216 for testing. A pull-up resistor 260 pulls the "B" input of logic block 118 to Vdd if one of the fuses 228–235 is opened.

Figure 3:
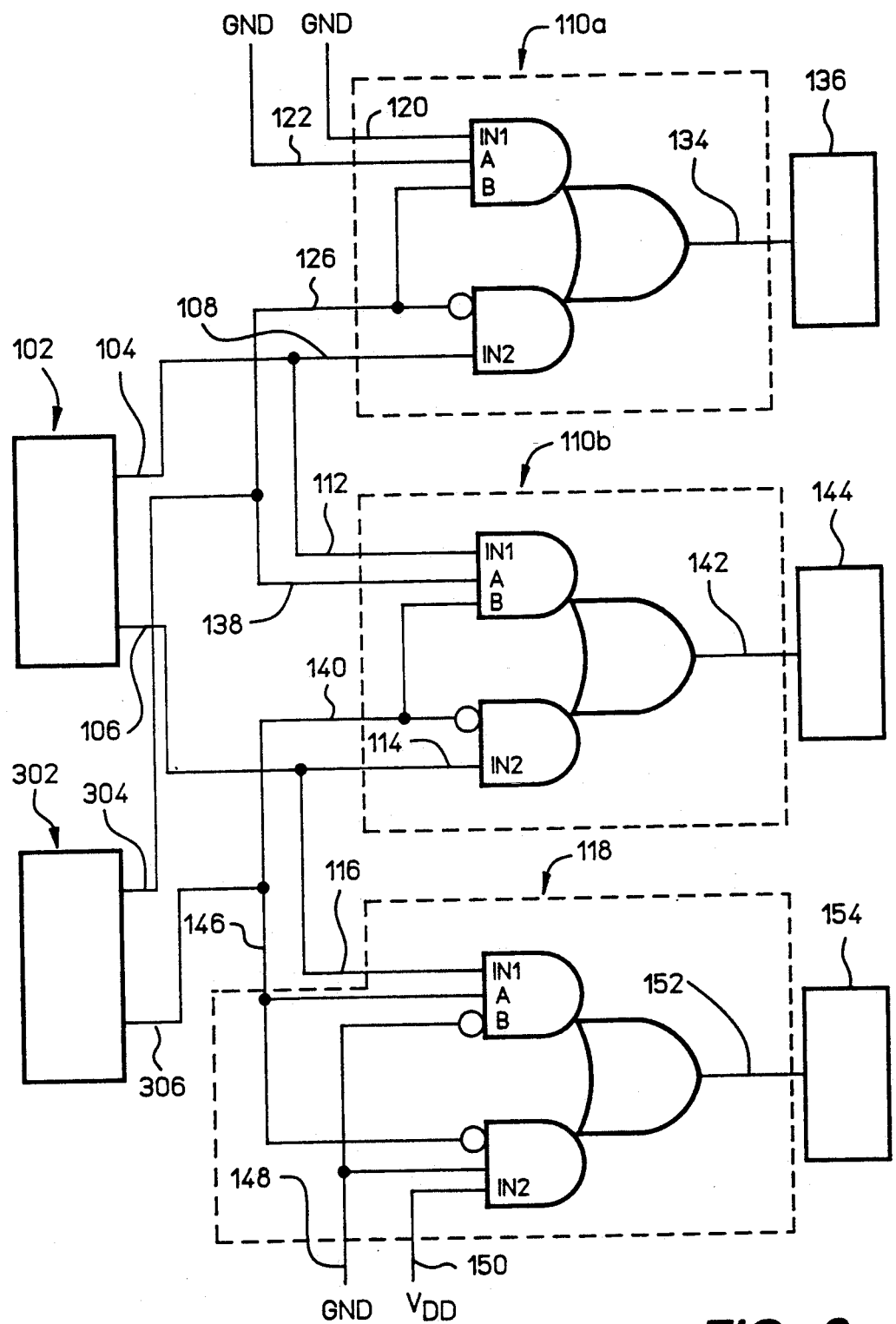
FIG. 3 is an alternate embodiment of the present invention with the fuses replaced by a programmable memory.

FIG. 3 is an alternate embodiment of the present invention with the fuses 128 and 130 (shown in FIG. 1) replaced by a programmable memory 302. The function of the circuit is as described for FIG. 1 with the outputs 304 and 306 programmed logically low if both memory blocks 136 and 144 are fully functional. If memory block 136 is defective, the outputs 304 and 306 would be programmed logically high thereby disabling memory block 136 and enabling the redundant memory block 154. If memory block 144 is defective, output 304 would be programmed logically low and output 306 would be programmed logically high thereby disabling memory block 144 and enabling the redundant memory block 154. Each of the outputs 304 and 306 and the fuses 128 and 130 are enabling link. The outputs 304 and 306 serve the same function as the fuses 128 and 130. An open enabling link, for example output 306 being programmed logically high, is equivalent to a fuse, here fuse 130, being open. If output 304 was programmed logically high, of course output 306 would have to be programmed high to achieve the same result as fuse 128 being open.

Of course, one skilled in the art could rearrange the select lines or circuitry without departing from this invention. For example, this invention would be advantageous in systems employing multiple microprocessors or other multiple circuit blocks. If the memory blocks were replaced by microprocessors, this invention allows a defective microprocessor to be replaced with ease.

The present invention solves a significant and expensive problem for the memory device industry, and while this invention has been described with reference to its presently preferred embodiments, it is not limited thereto. The scope of the present invention is limited only insofar as defined by the following set of claims and includes all equivalents thereof.

I claim:

1. An IC memory device comprising:
   a memory cell array comprised of a first and a second and a replacement memory block means, the first and second memory block means having an associated fusible link,
   wherein the first memory block means is comprised of an array of memory cells arranged in a matrix of rows and columns, the matrix including at least $(m+1)$ rows and $(n+1)$ columns where m and n are integers greater than 1,
   wherein the second memory block means is comprised of an array of memory cells arranged in a matrix of rows and columns, the matrix including at least $(p+1)$ rows and $(q+1)$ columns where p and q are integers greater than 1,
   wherein the replacement memory block means is comprised of an array of memory cells arranged in a matrix of rows and columns, the matrix including at least $(r+1)$ rows and $(s+1)$ columns where r and s are integers greater than 1; and
   a memory block selection means internal to the IC, the memory block selection means coupled to the first, second and replacement memory block means, the memory block selection means operative such that if the associated fusible link is blown, the memory block means associated with the blown fusible link is disabled and the replacement memory block means is enabled, whereby blowing the associated fusible link further shifts the input signals coupled to the disabled memory block means to a memory block means which is enabled.

2. A memory device as in claim 1 wherein:
   the replacement memory block means is tested by changing the logic state of a memory device pin.

3. A memory device as in claim 1 wherein:
   the replacement memory block means includes approximately the same number of memory cells as the first or second memory block means.

4. An IC memory device comprising:
   a first and a second memory block means having an associated fusible link means, wherein the first memory block means is comprised of an array of memory cells arranged in a matrix of rows and columns, the matrix including at least $(m+1)$ rows and $(n+1)$ columns where m and n are integers greater than 1,
   wherein the second memory block means is comprised of an array of memory cell arranged in a matrix of rows and columns, the matrix including at least $(p+1)$ rows and $(q+1)$ columns where p and q are integers greater than 1;
   a replacement memory block means,
   wherein the replacement memory block means is comprised of an array of memory cell arranged in a matrix of rows and columns, the matrix including at least $(r+1)$ rows and $(s+1)$ columns where r and s are integers greater than 1;
   a memory block selection means, internal to the IC, the memory block selection means being coupled to the first, second and replacement memory block means, the memory block selection means operative such that if a fusible link is blown, the memory block associated with the blown fusible link is disabled, the replacement memory block is enabled and the memory block selection means translates a block select for the disabled block means into a block select for a memory block means which is enabled.

5. A memory device as in claim 4 wherein:
   the replacement block means is tested by changing the logic state on a memory device pin.

6. A memory device as in claim 4 wherein:
   the replacement memory block means includes approximately the same number of memory cells as the first or second memory block means.

7. A memory device as in claim 1 wherein:
   the replacement memory block means is tested before blowing the fusible link.

8. A memory device as in claim 4 wherein:
   the replacement memory block is tested before blowing the fusible link.

9. A memory device as in claim 3 wherein the integers m, p, and r are of equal value and the integers n, q, and s are of equal value.

10. A memory device as in claim 6 wherein the integers m, p, and r are of equal value and the integers n, q, and s are of equal value.

11. An IC memory device comprising:
    a first and a second memory block means each having an associated fusible link means, wherein the first memory block means is comprised of an array of memory cells arranged in a matrix of rows and columns, the matrix including at least $(m+1)$ rows and $(n+1)$ columns where m and n are integers greater than 1, wherein the second memory block means is comprised of an array of memory cells arranged in a matrix of rows and columns, the matrix including at least $(p+1)$ rows and $(q+1)$ columns where p and q are integers greater than 1;
    a replacement memory block means,
    wherein the replacement memory block means is comprised of an array of memory cells arranged in a matrix of rows and columns, the matrix including at least $(r+1)$ rows and $(s+1)$ columns where r and s are integers greater than 1, wherein the integers m, p, and r are of equal value and the integers n, q, and s are of equal value; and
    a memory block selection means internal to the IC, the memory block selection means being coupled to the first, second and replacement memory block means, the memory block selection means operative such that if a fusible link is blown, the memory block associated with the blown fusible link is disabled, the replacement memory block is enabled and the selection means translates a block select for the disabled block means into a block select for a memory block means which is enabled, wherein reading a cell in an enabled memory block does not increase the signal to noise ratio.

12. A memory device as in claim 11 wherein:
the replacement memory block means is tested by changing the logic state of a memory device pin.

13. A memory device as in claim 11 wherein: the replacement memory block means is tested before blowing the fusible link.

14. A memory device as recited in claim 1 wherein reading a cell is performed without adding to the connection length of the memory array.

15. A memory device as recited in claim 1 wherein reading a cell performed without increasing the signal to noise ratio.

16. A memory device as recited in claim 4 wherein reading a cell is performed without adding to the connection length.

17. A memory device as recited in claim 1 wherein reading a cell is performed without increasing the signal to noise ratio.

* * * * *